United States Patent [19]

Van Dyke

[11] Patent Number: 4,517,839
[45] Date of Patent: May 21, 1985

[54] OFF-HIGHWAY VEHICLE SYSTEMS SIMULATOR AND CONTROL PANEL TESTING

[75] Inventor: Harry Van Dyke, Niagara Falls, Canada

[73] Assignee: Unit Rig & Equipment Co., Tulsa, Okla.

[21] Appl. No.: 510,759

[22] Filed: Jul. 5, 1983

[51] Int. Cl.³ .............................................. G01R 31/00
[52] U.S. Cl. ................................. 73/432 R; 324/73 R; 324/73 AT; 324/158 MG
[58] Field of Search ............................ 73/432 V, 1 R; 324/158 MG, 73 AT, 73 R; 364/578

[56] References Cited

U.S. PATENT DOCUMENTS

| | | | |
|---|---|---|---|
| 3,699,440 | 10/1972 | Johnson | 324/73 R |
| 4,002,972 | 1/1977 | Konrad et al. | 324/73 R |
| 4,002,973 | 1/1977 | Weisendanger | 73/432 V |

*Primary Examiner*—S. Clement Swisher
*Attorney, Agent, or Firm*—William S. Dorman

[57] ABSTRACT

An off-highway vehicle systems simulator and control panel testing apparatus produces electrical signals that simulate the electrical signals generated by detectors on the vehicle when it is operating. The electrical signals are generated from four direct current power supplies and an AC frequency generator. The signals are directed to specific circuits within the control panels by a plurality of switches that essentially route the signals to specific pin locations on the control panel. The control panel is electrically coupled to the simulator by a harness having multipin plugs and mulitpin connector elements. Analog and digital monitors measure the output of the so treated panels, which is compared to outputs for correctly operating panels. Indicator lights are used to determine the status of the simulator and various circuits in the control panel.

20 Claims, 9 Drawing Figures

OFF-HIGHWAY VEHICLE SYSTEMS SIMULATOR AND CONTROL PANEL TESTING

BACKGROUND OF THE INVENTION

1. Field of the Invention

The invention is directed to an electronic control panel testing apparatus which electronically simulates the operations of an off-highway vehicle. A technician inputs electronic signals from the apparatus into a control panel for a vehicle, visually monitors the results, and compares the results with the projected results for a correct control panel.

2. Description of the Prior Art

Many of the functions and operations of large off-highway vehicles are controlled eletronically by circuitry mounted on replaceable panels (boards or cards). As such, when the vehicle appears to be malfunctioning, the operator must determine if something is wrong with the electrical or mechanical system of the vehicle.

Previously, for a technician to determine if a control panel was operating correctly, various power supplies, meters an associated wiring would be gathered on board the vehicle having the potentially defective panel. The electrical signals necessary to manipulate the control panel would result from operating the truck and manipulating the testing equipment appropriately.

In the prior method of testing the control panel the technician and testing equipment was exposed to vibrations, noise, and dangerously high voltage levels (up to 1600 volts) immediately adjacent to the control panel. Furthermore, it was necessary to employ an assistant to operate the vehicle during testing and take the vehicle out of service for testing and repairs on the electronic control panel. Therefore, testing the control panel was a relatively costly procedure.

In addition to the cost involved in testing the panels, it was also difficult to achieve accurate measurements due to the testing conditions. Road conditions such as bumps and potholes result in considerable difficulty both in reading the meters and attempting to make adjustments on the control panels being tested. The hostile environment on board the operating vehicle frequently caused a loss of calibration of the test equipment.

Simulators have been used to test the electrical systems on automotive vehicles, as disclosed in U.S. Pat. Nos. 4,300,205 and 4,339,801. These automotive simulators have been designed for cars having simpler electrical monitoring and control systems and lower voltage inputs than off-highway vehicles control panels. In addition monitoring and recording systems have been mounted on highway trucks to monitor engine parameters that can be later analyzed, as disclosed in U.S. Pat. No. 4,258,421.

SUMMARY OF THE INVENTION

The present invention comprises a truck systems simulator and control panel testing apparatus which is operated by a technician at a laboratory bench, outside of the vehicle. The technician manipulates the electronic signals inputted into the control panel and visually monitors the results on a monitor means or other visual indicators. The electronic signals inputted into the control panel represent electrical signals which simulate electrical signals developed by detectors, on a truck during operation, indicating various operating parameters. The results monitored by the technician are compated with the projected operating results of a correct control panel and the panel's status and the status of specific circuitry in the panel is determmined.

The present simulator and testing apparatus is relatively small and formed into a single compact unit. The apparatus comprises a plurality of power supplies, and a frequency generator, which provides electrical signals that are inputted into the control panel. The electrical signals include various voltage levels and frequencies which represent various normal operating electrical signals received by the control panel when it is mounted in an operating vehicle. Monitor means measure the frequency and voltage level of the signals directed to the control panel. In addition, the monitor means and visual indicator means also produce visual signals representing the output of the control panel being tested. The apparatus is also provided with an Alternator Field Static Exciter (AFSE) and Motor Field Static Exciter (MFSE) pulse test card for simulating the fields and testing the AFSE and MFSE circuits on the control panel. A switching means directs the correct electrical input signal to the correct circuit in the control panel. The control panel is electrically coupled to the testing apparatus by an interconnecting harness specifically designed to that particular model of control panel.

Accordingly, it is an object of the invention, to provide an organized and compact means of supplying the required signals, power supplies, inputs and outputs to the electronic control panel under test for purposes of calibrating, troubleshooting and repairing the control panel.

Another object of the invention is to provide a noise and vibration free environment in which to perform work on the electronic control panel under test.

Another object of the invention is to provide the required means to connect the panel under test to the invention with a maximum of two connections to eliminate the confusion of mass wiring.

Another object of the invention is to provide a safe means of supplying the high voltage levels required to exercise the control panel under test and to eliminate the dangers involved with connecting wiring and making adjustments in close proximity to open high voltage points on the vehicle.

Another object of the invention is to provide monitoring devices with which to analyze the performance of the panel under test and with which to monitor the status of the inputs and outputs of the invention.

A further object of the invention is to provide all the signals, power supplies, input and outputs required to manipulate the electronic control panel under test.

Yet a further object of the invention is to provide the ability to control the test functions in such a way that a logical procedure may be taken in single step fashion, if desired, to perform the testing of the control panel under test. Specifically, it is possible to direct a single control signal to a singular section of the control panel to the exclusion of all other control signals for the purpose of examining a specific function and circuit of the control panel. This is necessary in order to provide a logical, effective troubleshooting function.

Additionally, there is provided, methods by which the results of control signals can be observed and measured for comparison against established standards. Established standards are provided by data as laid out in the testing procedure. The testing procedure is provided to guide the operation of the invention.

There is further provided, the methods by which the input signals must be directed to the panel under test, the levels of the inputs required, the frequency of the inputs and the timing. Additionally, there are provided the means for monitoring the input signal levels and frequency to ensure accuracy.

The monitoring devices may also be directed to any portion of the circuitry of the panel under test at the discretion of the operator for purposes of isolating problem areas or observing signals of interest.

Means are provided by which the monitoring devices may be used in the testing and repair of electronic equipment not even related to the invention or its primary function. Examples would be such as the testing and repair of radios or similar electronic devices.

Means are also provided to make the various power supplies available for use, in the testing and repairs of various electronic devices not related to the invention or its primary function. Similarily means are provided to utilize outside sources of power, in the event of a failure of the internal main power supply.

Another object of the invention is to provide the means to simulate the operation of the electric propulsion system of an off-highway ore hauling vehicle. The invention control means are configured in such a way that all aspects of the vehicle performance can be simulated. Data can be gathered, observed and measured on the monitor means, and then compared against established standards. Established standards are provided by the invention.

BRIEF DESCRIPTION OF THE DRAWINGS

The objects of the invention will become clear in connection with the foregoing description taken in conjunction with the drawings wherein.

DETAILED DESCRIPTION

General Overview

Figure 1:
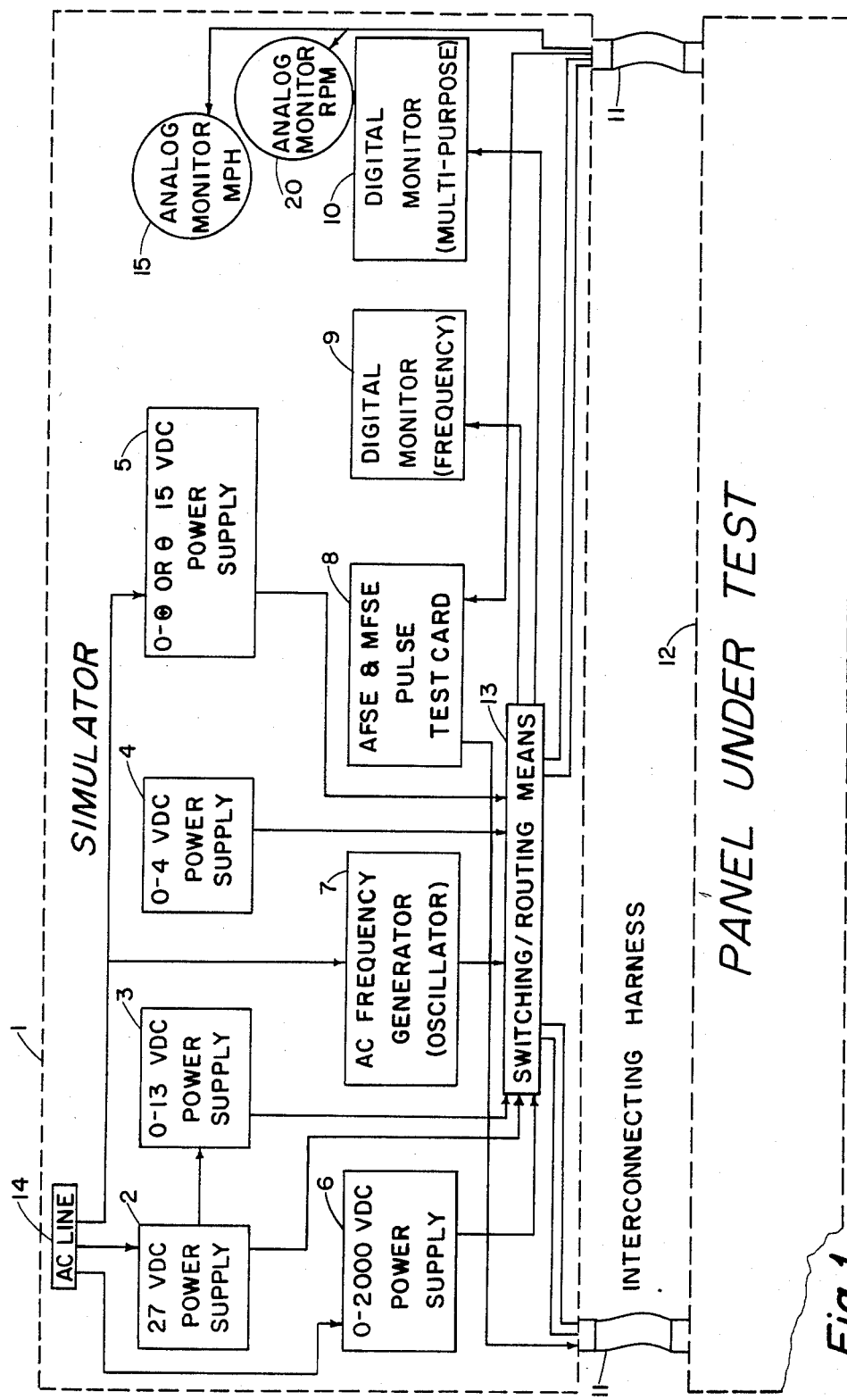
FIG. 1 is an overall block diagram of the major components of the invention shown connected to the panel under test and interfaced to each other.

The block diagram illustrated in FIG. 1 illustrates a simulation and testing apparatus 1 for use in testing control panel 12. Simulator and testing apparatus 1 comprises a 27 VDC power supply 2, a 0 to 13 VDC power supply 3, a 0 to 4 VDC power supply 4, a 0 to positive or negative 15 VDC power supply, a 0 to 2000 VDC power supply 6, an AC frequency generator 7, analog monitors 15 and 16, an AFSE and MFSE pulse test card 8, a digital frequency monitor 9, a digital multi-purpose monitor 10, switching/routing means 13 and interconnecting means 11.

Figure 7:
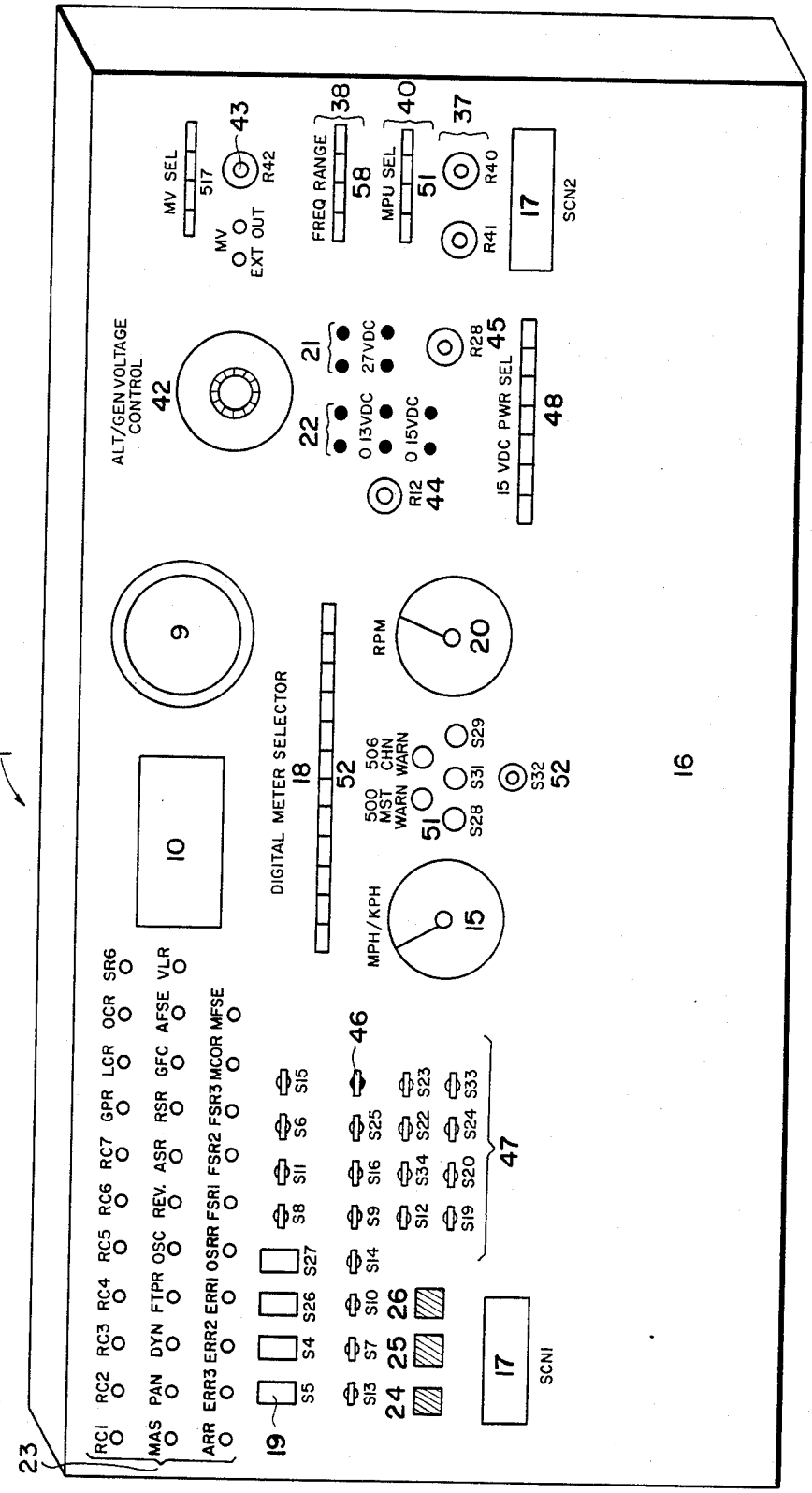
FIG. 7 shows a view of the front panel of the invention with the control and monitor means.

The major components of simulator 1 are housed in a compact metal housing. In a prototype, the housing was 30.5 inches long, 11.25 inches wide and 19.5 inches high. Two retractable handles are provided to allow easy transport of the simulator. A socket is provided at the rear of the housing to facilitate connection of the simulator to a main power source, a conventional AC cord. The front panel designated 16 in FIG. 7, is made of LEXAN and bolted to the front of the housing. The switching means is mounted onto front panel 16 from the rear by suitable attachment means.

Interconnecting means 11 comprises two harnesses having multipin (104 PIN) connector plugs which are connected to receivers 17 on front panel 16. The harnesses are also provided with another connecting element for electrically coupling the harness to the control panel to be tested. A number of different models of the control panels can be tested by simulator 1 by providing a number of harnesses having specifically designed connecting elements designed specifically for each model of control panel to be tested.

The status of the power supply is monitored for various operations on digital monitor 10. The digital monitor is mounted on panel 16, the specific operation to be monitored by the digital monitor is controlled by digital meter selection switch 18. The digital connector switch comprises a number of push buttons each representing a specific operation to be monitored although a variety of multi-selection switches could be used.

All of the control means and switching means are located on front panel 16 for easy access by the testing technician. Master switch 19 is connected to the master power source, AC line 14, and can be used to start up or shut down the entire system.

Analog monitors 15 and 20 are the exact duplicates of the instruments found on the actual vehicle, thereby providing a high degree of accuracy and stability between readings taken on the simulator and those to be expected on the actual operating vehicle.

The analog and digital monitors comprise a plurality of monitor means.

Output posts 21 are provided on the front panel of the simulator to add flexibility to the simulator. The output post can be selectively connected to the outputs of the 0 to 27 VDC power supply 2, the 0 to 13 VDC power supply 5 and the AC frequency generator; so that these electrical signals can be used to test other electronic devices other than control panels. However, the primary function of the simulator is testing control panels and as such, normally the power supplies and frequency generator are connected through the switching means to interconnection means 11.

Input posts 22 are also provided on the front panel to permit the use of digital monitor 10 when testing other electronic devices. Normally, the digital monitor can be directed to the desired circuits by switching means 18 as already discussed through the interconnecting means.

In addition to digital monitors 9 and 10, and analog monitors 15 and 20, there are provided a number of indicator lights 23 comprising a plurality of indicator means. The indicator means display events occuring during testing of the control panel, such as the status of the various power supplies and the master switch.

AC fuse 24, DC fuse 25 and DC fuse 26 are located on the front of the panel for easy access and protect the main power source 14, 27 VDC power supply 2 and 0 to 2000 VDC power supply 6, respectively.

The wiring interconnecting the monitors, indicator means, and the switches is located at the rear of the front panel. The wiring provides a permanent interface between the various monitor means, indicator means, the power supplies, and switching means. In addition to electrically connecting all of the components together the wiring also electrical connects the components to interconnection means 11 so that the panel can be tested.

27 VDC Power Supply

Figure 2:
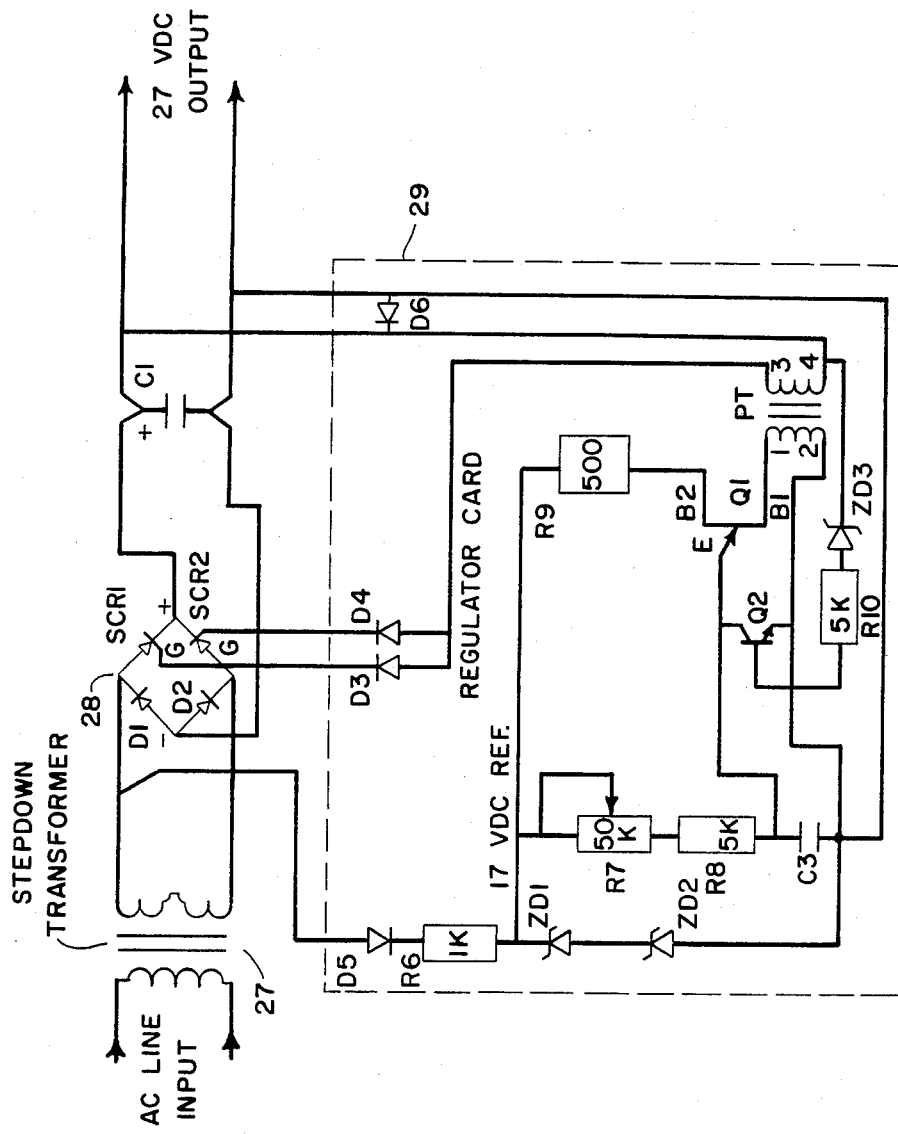
FIG. 2 is a schematic diagram of the main 27 VDC power supply and the regulator card.

A detailed schematic of the 27 VDC power supply 2 is shown on FIG. 2. As can be seen, this is a very compact circuit utilizing a standard HAMMOND 167S30 stepdown transformer 27 and full wave bridge rectifier 28, consisting of two diodes and two Silicon Controlled Rectifier's (SCR's). Since extremely tight regulation of the power is not required, the circuit could be made extremely compact. Essentially the output of bridge rectifier assembly 28 is controlled by phase shifting the AC voltage supplied to it from transformer 27. This is accomplished by controlling the timing of the SCR gate pulses supplied by regulator card 29. Regulator card 29 takes a sample of stepdown transformer 27 output, rectifies it to DC by D5, regulates it to a 17 VDC reference voltage by zener diodes, ZD1 and ZD2, and uses that 17 volt reference to generate a D.C. pulsing voltage at the emitter of uni-junction transistor 01. The frequency of the pulsing voltage is controlled by the setting of resistor R7. As long as transistor Q1 is being forward biased by the pulses, the output of Q1 is taken to a one to one pulse transformer PT and supplied to the gates of the SCR's in full wave bridge rectifier 28. Current is then free to flow through the rectifier to filter the output voltage rise above 27 VDC as in the case of a low demand on which, in turn, will stop the pulses to the emitter of transistor Q1 and the bridge rectifier output will, of course, drop until it goes below 27 VDC when the process will reverse itself again.

0 to 13 VDC Power Supply

Figure 4:
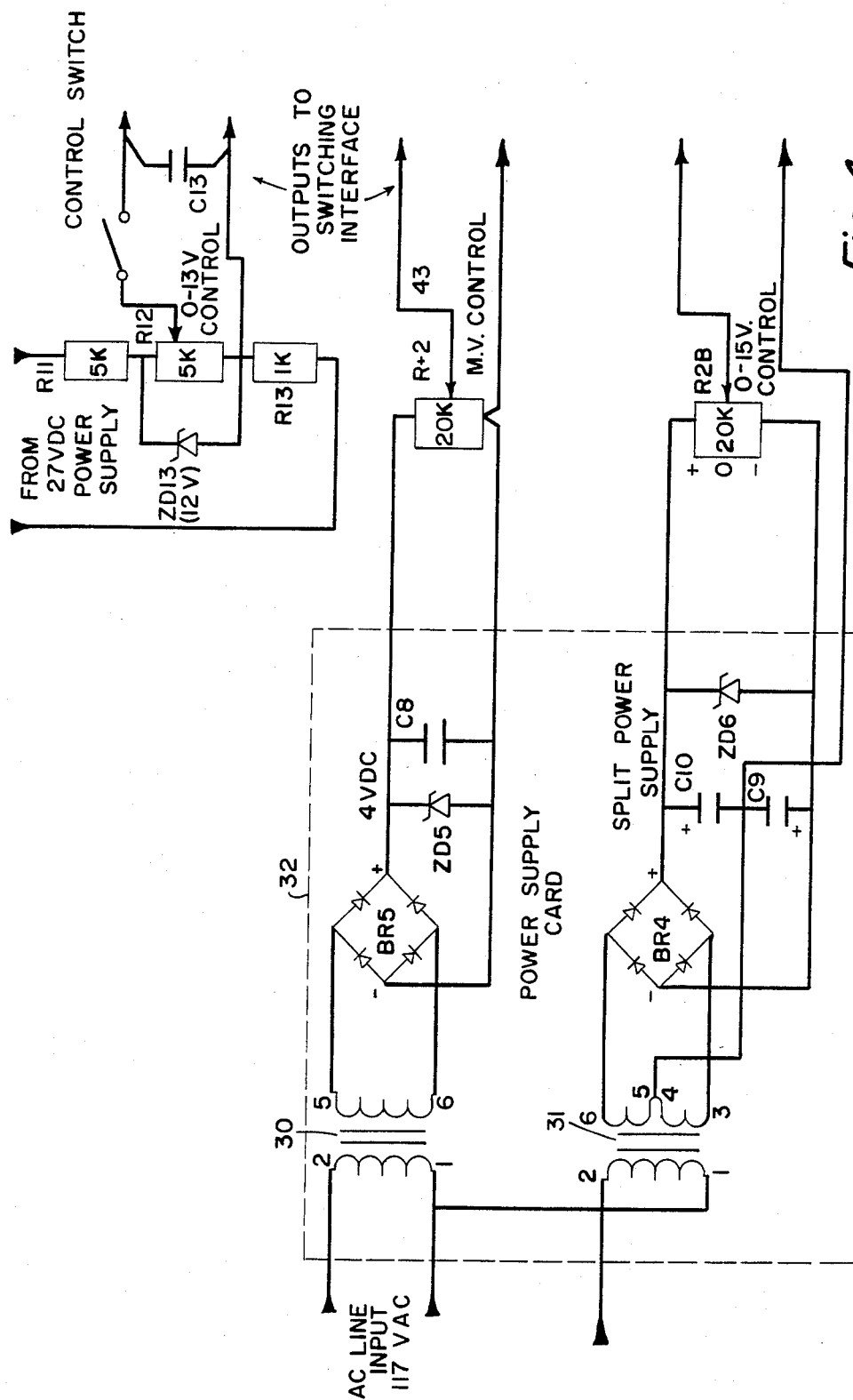
FIG. 4 is a schematic diagram of the 0 to 4 VDC power supply and control means; the 0 to 13 VDC power supply and control means; and the 0 to positive or negative 15 VDC power supply and control means.

FIG. 4 reveals that the 0 to 13 VDC power supply 3 is simply a variable voltage divider consisting of three resistors, two fixed resistors, R11 and R13, and one variable resistor R12. A stable voltage controlled by zener diode ZD13 is applied to resistor R12 and a portion depending on the position of resistor R12 control as dictated by the operator, is taken through the control switch to the output terminals. High frequency noise is filtered out by capacitor C13. This design is extremely compact and efficient as is required by the design parameters of the simulator enclosure.

0 to 4 VDC (Millivolt) Power Supply

FIG. 4 shows that the 0 to 4 VDC power supply 4 is also a very compact design. In order to provide total isolation, separate transformer 30 is utilized for raw voltage which is then rectified to DC by bridge BR3, regulated to 4 VDC by zener diode ZD5, filtered by capacitor C8, and output controlled by variable resistor R42 which is manipulated by the operator.

0 to ⊕ or θ 15 VDC Power Supply

FIG. 4 outlines the schematic for the 0 to positive or negative 15 VDC power supply 5. Split output transformer 31 is used in order to provide both isolation and the means to enable the output of the power supply 5 to go either positive or negative in respect to the common return line which is the centre tap of transformer 31. Output from the transformer 31 is rectified to DC by bridge BR4, filtered by capacitors C10 and C9, regulated to 30 VDC by zener diode ZD6 and output controlled by variable resistor R28 which is manipulated by the operator. As in the 0-4 VDC power supply 4, it was vital to keep within design parameters that limited space, so the design of the supply is very compact. Both the 0-4 VDC supply 4, and the 0 to positive or negative 15 VDC supply 5 are mounted on a small PC board which is plugged into the rear of front panel 16.

0 to 2000 VDC Power Supply

Figure 3:
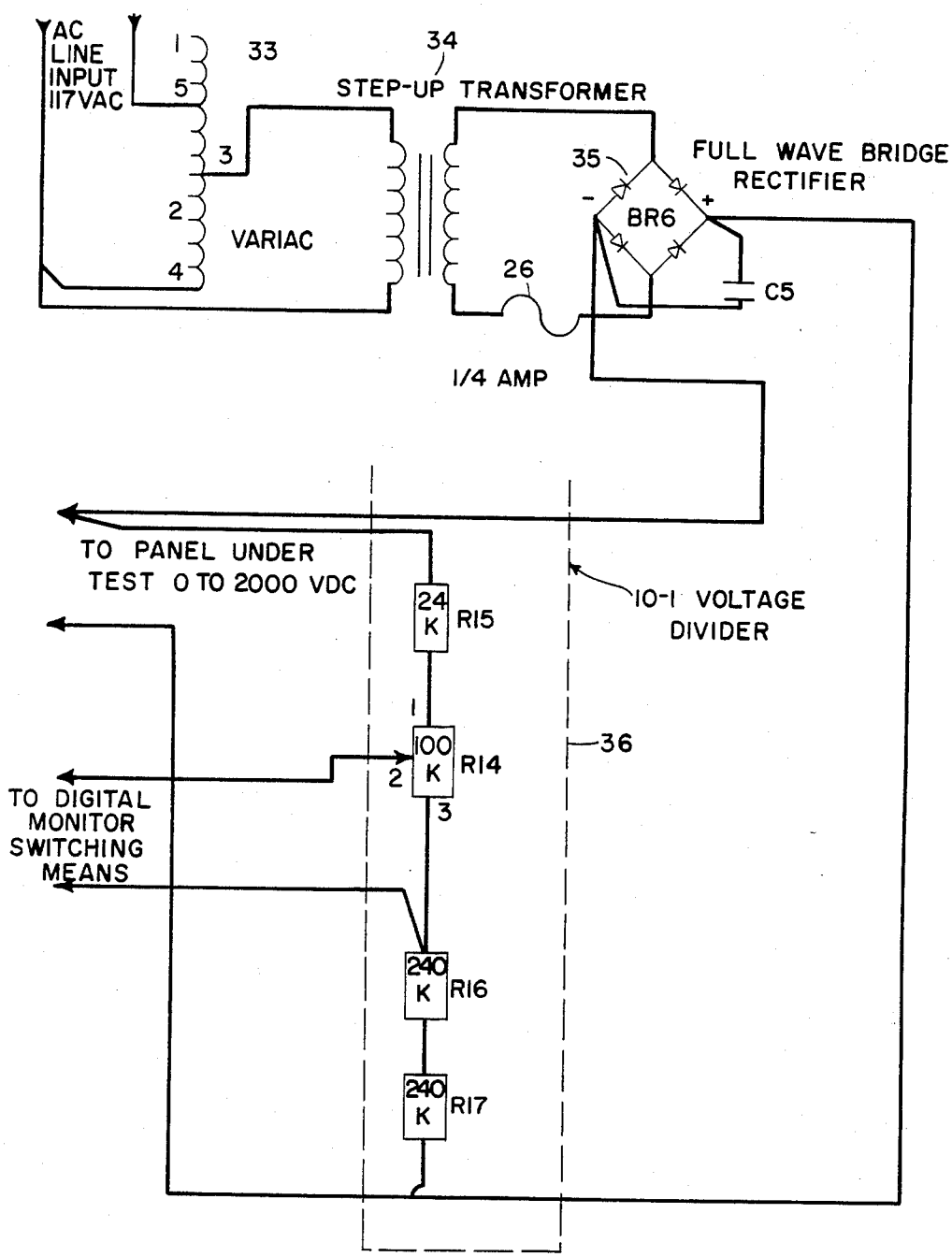
FIG. 3 is a schematic diagram of the 0 to 2000 VDC power supply and the 10 - 1 voltage divider.

FIG. 3 discloses the schematic of the 0 to 2000 VDC power supply 6. The main power supply input is taken from the control switch directly to a SUPERIOR 21 variac 33 which is basically a variable auto-transformer. Variac 33 is direct coupled to a HAMMOND 714 transformer 34. This combination allows the high level output of step-up transformer 34 to be controlled by low level controller 33. Output from step-up transformer 34 is delivered through protective fuse 36 to full wave bridge rectifier 35, filtered by capacitor C5 and taken to the 10-1 voltage divider 36. The purpose of the voltage divider is to reduce the voltage levels delivered to digital monitor switching means 18 and ultimately to digital monitor 10 itself. This is for safety reasons and for protection of the digital monitor 10. Calibration potentiometer R14 is provided on voltage divider 36 to facilitate calibration of the output to the digital monitor switching means.

AC Frequency Generator

Figure 5:
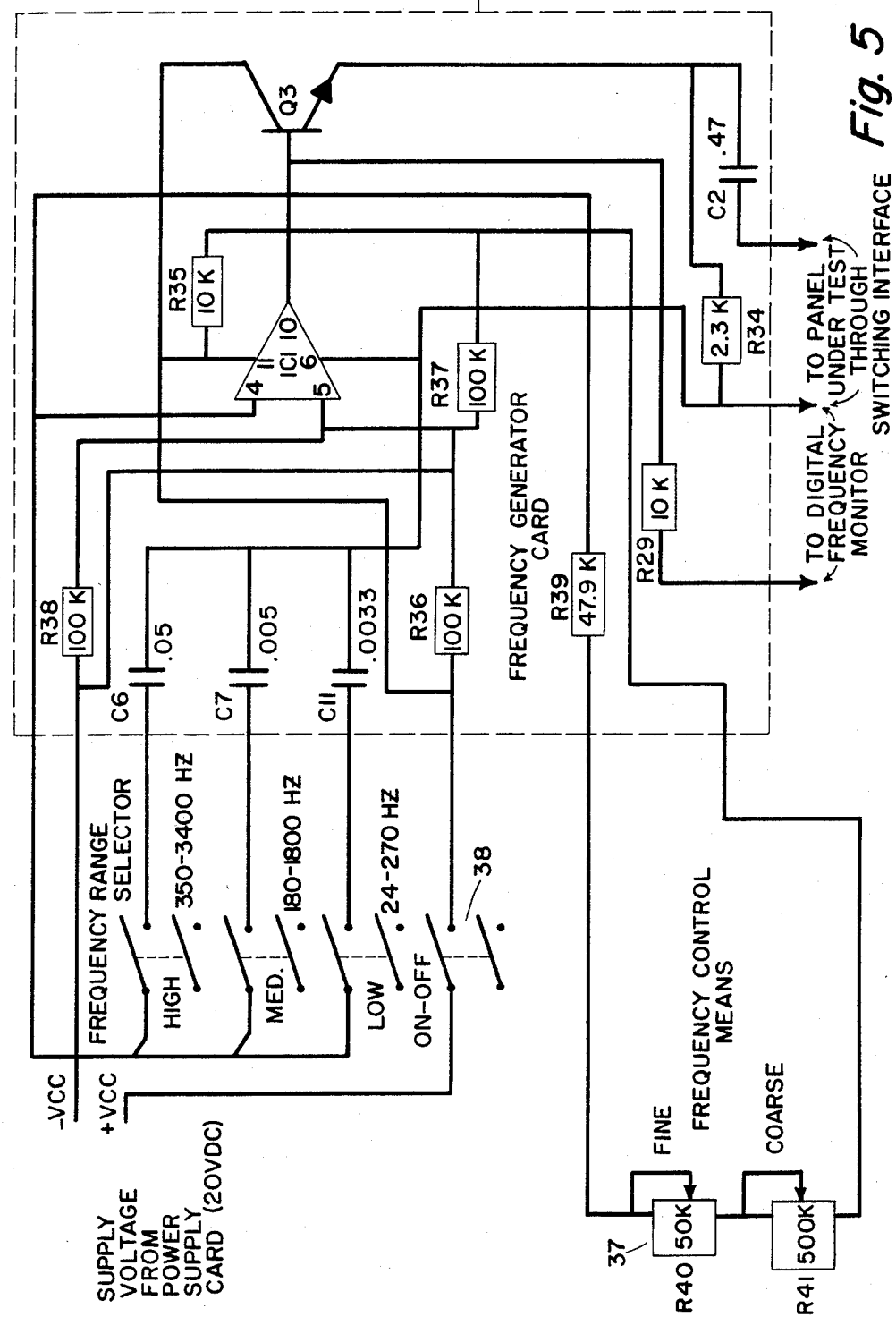
FIG. 5 is a schematic diagram of the AC frequency generator and control means.

FIG. 5 discloses the schematic of AC frequency generator 7. Basically, the circuit is designed to produce an infinitely adjustable AC signal at an amplitude of 6 VRMS with a minimum frequency of 24 HZ to a maximum frequency of 3400 HZ. The waveform is square and output is controlled by frequency control means 37, which are located on front panel 16. Power to operate frequency generator 7 is taken from a 20 VDC power supply located on power supply card 32. The output range is selected by switching means 38 which is located on front panel 16. The low range position permits a frequency range of from 24 to 270 HZ. The medium position permits a frequency range of from 180 to 1800 HZ and the high position permits a frequency range of from 350 to 3400 HZ. The range selector functions by effectively imposing a capacitance across the power supply negative terminal and the inverting input of operational amplifier chip IC1. This causes operational amplifier IC1 to begin oscillating at a rate determined by the capacitor selected and the resistance selected by the frequency control means 37. The oscillating output of IC1 is taken directly to the base of transistor Q3 which amplifies and shapes the signal. The output is then capacitor-coupled to filter out any DC voltage present and routed directly to switching interface 40 mounted on front panel 16. An additional output is provided from the IC1 to provide a frequency feedback to digital monitor 9. The components of the frequency generator are mounted on printed circuit board 39 in order to comply with the design parameters which dictates that the circuitry must be extremely compact. Special consideration was made to ensure proper isolation of the various circuit traces on circuit board 39 because of the tendencies of oscillating signals to impose noise or RF interference onto nearby circuit traces. In order to keep stray signals to a minimum, trace polarities were observed and routing was optimized to avoid crossing of traces or wiring carrying oscillating signals. Shielded wiring is utilized in connecting switching interface 40, frequency range selector 38, and frequency control means 37. The output of the so constructed AC frequency generator 17 is quite stable and accurate.

AFSE & MFSE Pulse Test Card

Figure 6:
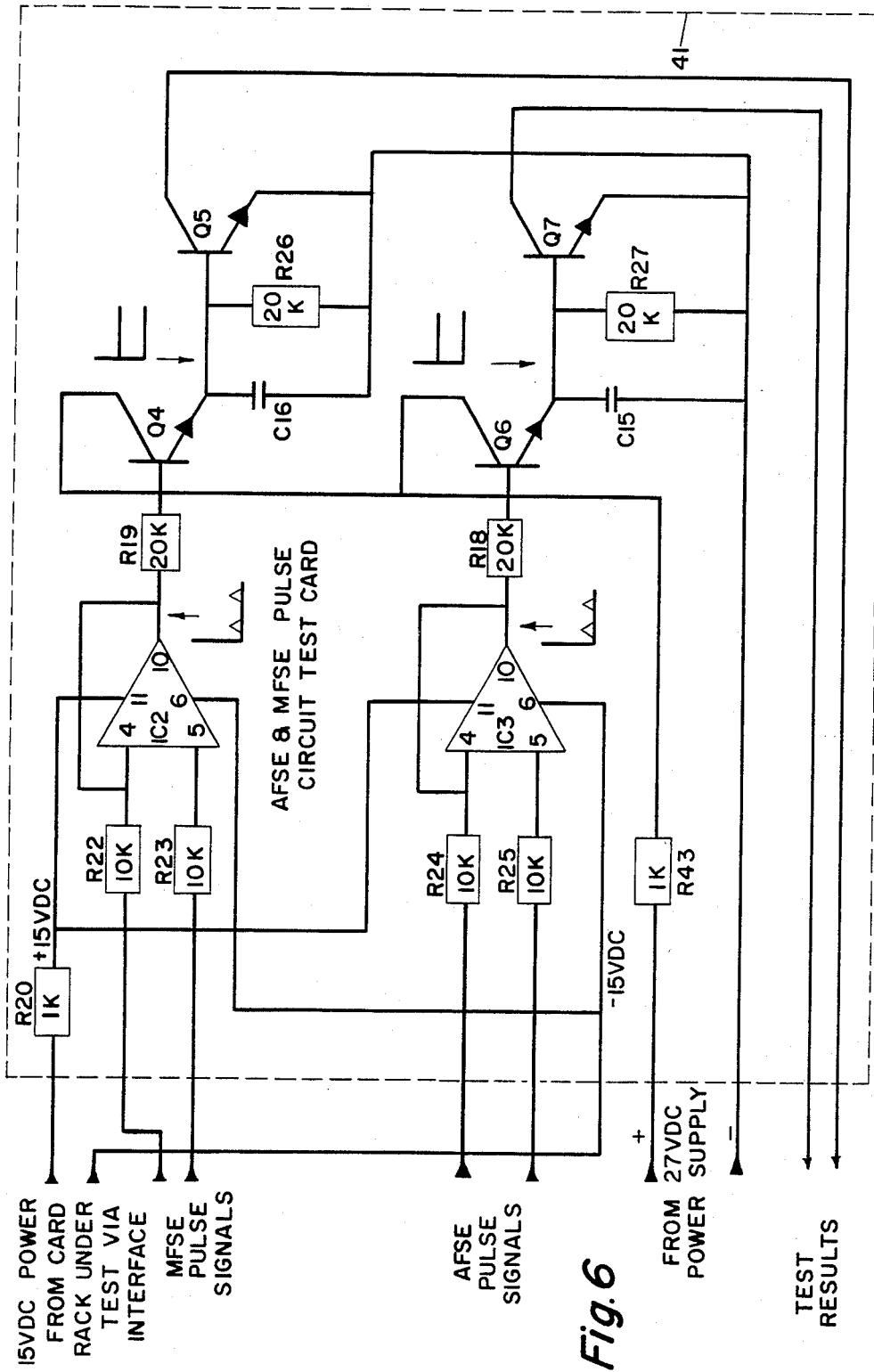
FIG. 6 is a schematic diagram of the AFSE and MFSE pulse circuit test card.

FIG. 6 shows the schematic of the Alternator Field Static Exciter (AFSE) and Motor Field Static Exciter (MFSE) pulse test card 8. The purpose of this card is to monitor the output signals of the AFSE and MFSE circuits of control panel 12 under test and provide a visual indication thereof. Since the output signals of the AFSE and MFSE circuits of the control panel under test are minute and high frequency, it is necessary to amplify and condition them in order to enable a visual indication such as an indicator light 23. This is accomplished by inserting the AFSE and MFSE signals into differential amplifiers IC2 and IC3, coming out as a positive signal to the case of transistors Q4 and Q6 which are part of a darlington-type transistor amplifier and then as a high level DC voltage to one of the indicator lights 23 which are mounted on front panel 16. Since both the AFSE and MFSE are identical but separate circuits, test card 8 was designed to allow either separate or combined tests to take place. The 15 VDC power required to operate AFSE and MFSE pulse test card 8 is taken directly from panel under test 12. The power source for darlington transistor amplifier Q4, Q5 and Q6, Q7, is taken from the simulator 27 VDC power supply 2. All the components for AFSE and MFSE pulse test card 8 are mounted on circuit board 41, as mentioned previously for reasons of space limitations.

Front Panel

The front panel of the simulator, as discussed earlier, provides a supporting surface for the switching means, monitor means, the interconnecting means, power supply controls and all other control devices. Digital monitor 10, as selectively controlled by switch 18, monitors all of the plurality of power supplies and the performance of the panel being tested. Digital monitor 9 is used to monitor the output of the AC frequency generator. Analog monitors 15 and 20 are also used to monitor the performance of the panel under test in operational criteria, for example revolutions per minute and miles per hour.

Alternator/Generator Voltage control 42 is directly coupled to variac 33 thereby controlling the output of the 0 to 2000 VDC power supply. The technician by rotating control 42 either clockwise or counterclockwise affects the output of this power supply.

MV supply selector 49 and MV control 43 (variable resistor R42) control the routing and the voltage level of the 0 to 4 VDC power supply. More specifically, selector 49 directs the output of the power supply to several different circuits and by manipulating control 43 the output level of the power supply can be adjusted. Selector 49 is an interlocking switch which prevents more than one specific circuit being selected at any one time.

Frequency range switch 38 allows the technician to select one of three frequency ranges, or to turn the AC frequency generator off. MPU selector 40 directs the selected frequency to a specific circuit as desired by the technician. For example, one position of the selector switch may represent the speed of the left rear wheel of the vehicle, and by depressing the selector for this circuit the frequency signal would be directed to that circuit monitoring that condition in the control panel. The selector also allows that the output of the AC frequency generator be directed to output posts 21 for testing other external electrical devices. Control knobs 37 are connected to variable resistors R40 and R41 so that further adjustments of the signal can be made.

Control 44 is used to control the output of the 0 to 13 VDC power supply. Control 44 is coupled to variable resistor R12, as illustrated in FIG. 4, and is directed to output posts on the front panel and to the interconnection means where it provides a voltage signal to the control panel undergoing testing.

Control 45 is coupled to variable resistor R28 as illustrated in FIG. 4, and controls the output of the 0 to positive or negative 15 VDC power supply. Resistor 28 is a ten turn potentiometer and provides a positive signal when rotated clockwise and a negative signal when rotated counterclockwise from its center. The output of this power supply is directed by selector 48 which is an interlocking push button switching means. The selector directs the signal to various circuits to be tested inside the control panel through interconnection means 11. This power supply is also connected to a post on the front panel when used in testing other electrical devices.

Indicators 50a and 50b and test switch 51 are specifically designed to test the vehicle isolation warning panels. The isolation warning panels are circuit boards that monitor the vital functions of the vehicle, such as, water temperature, oil pressure, oil temperature, etc. The isolation warning panel can have up to twelve channels for twelve different vital functions depending upon the options selected by the user. Channel selector switch 52 is used to select the desired channel to be tested. Switch 51 is then depressed to initiate the test with indicators 50a and 50b providing the test results. Indicator lights 50a and 50b together with indication lights 23 form the plurality of indication means.

Master switch 19 is used to totally deenergize all the circuits of the simulator, when not in use or being repaired. Panel power switch 46 only deenergizes the control panel undergoing testing, so that troubleshooting and repairs can be conducted on the control panel. Remaining switches 47 are utilized by the technician to direct the various power supplies and signals to the various circuits in the control panel being tested. Switches 47 together with the various selector switches forms switching/routing means 13 for directing electrical signals to the control panel.

Figure 8A:
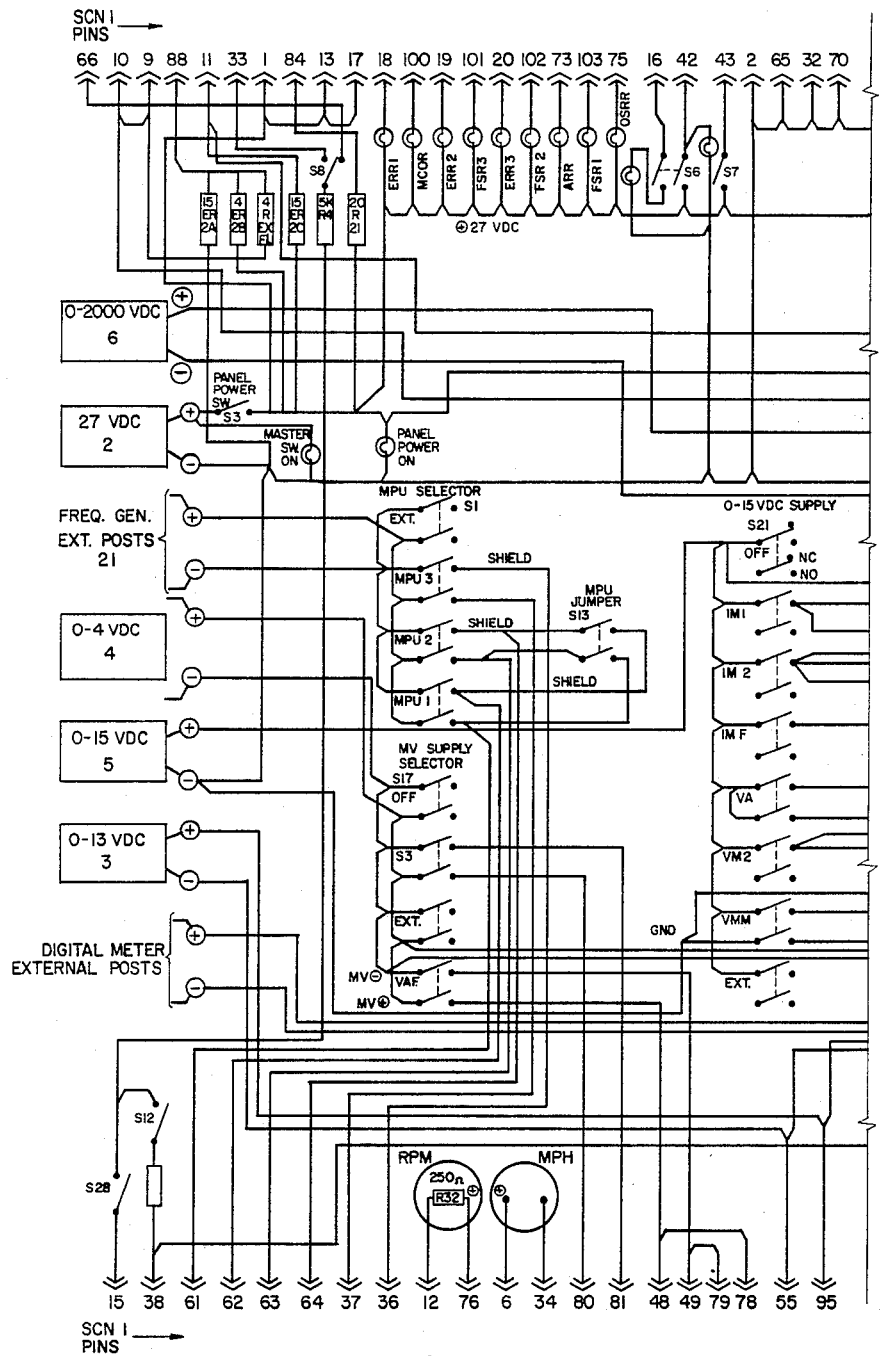
FIG. 8 is a schematic diagram of the switching/routing system for the panel illustrated in FIG. 7.
Figure 8B:
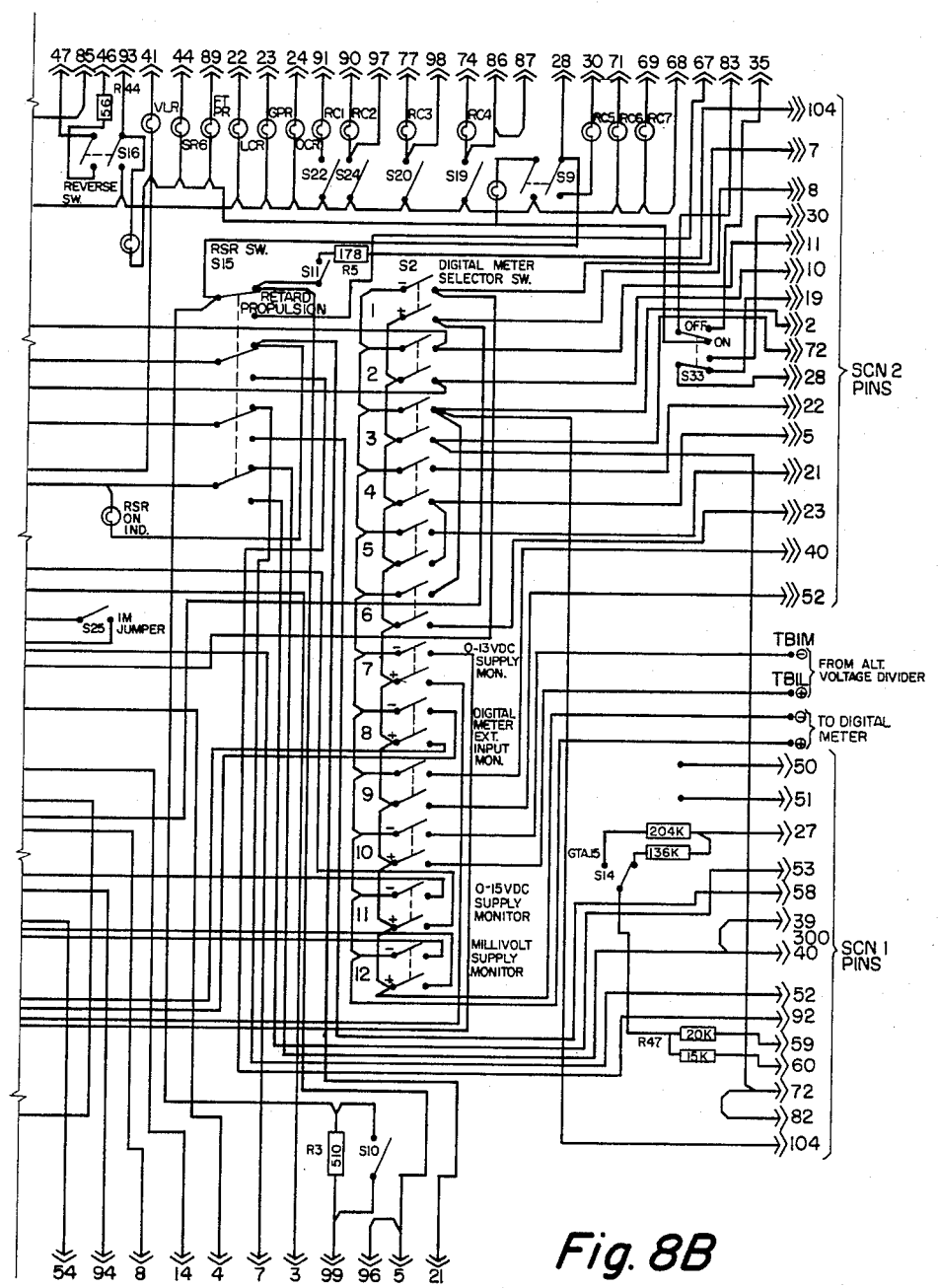

FIG. 8 provides a schematic diagram of the specific wiring for switching/routing means 13 as designed for the switches and controls of front panel 16. As can be understood by a person having ordinary skill in the art, the various selector switches route electrical input signals specific pin connections of the electronic control panel so that the correct signal is inputted at the correct place in the panel. The outputs of the control panel are also selectively routed to monitor means and indicator lights as illustrated in the diagram.

Operation

To test a control panel, it is first connected to the interconnection means of the simulator. Various power sources and electrical signals are then directed to the panel as called for in the testing standards for the panel. The results of the testing are recorded and then compared with the established standards for the control panel under test. For some tests the results will only comprise the turning on or off of an indicator light when a specific signal level is reached for a specific circuit in the control panel. For other circuits the output of the circuit is measured on various monitor means and plotted generating a response curve for the circuit which can be compared with the standard curve for a correctly operating circuit.

Therefore, when a control panel is suspected of being defective a technician can remove the panel and replace it with a new one without taking a vehicle out of service to conduct testing. The technician can then couple the suspected panel to the present apparatus in a non-hostile setting, where the panel can be tested and its status and that of its individual circuits established.

As will be readily apparent to a person having ordinary skill in the art, that the standards to which a control panel is compared can be determined by testing a correctly operating panel with the subject apparatus and establishing the necessary criteria for testing a defective panel.

Although the subject apparatus has been describe in terms of a specific embodiment it should not be so limited, but is to be limited solely to the claims that follow.

What is claimed is:

1. An off-highway vehicle simulator and control panel testing apparatus for out of vehicle testing of electronic control panels by simulating the electronic input signals an electronic control panel would detect during different operating modes of a vehicle, and displaying the outputs of an electronic control panel being tested, an electronic control panel is provided with a number of circuits for monitoring and controlling the operations of a vehicle, the simulator and testing apparatus comprising:
   a plurality of power supplies having different voltage ranges which are connected to a master power supply, said plurality of power supplies provide a plurality of power sources for the simulator and testing apparatus;
   an APSE and MFSE testing circuit for providing an AFSE and MFSE circuit diagnostic function for an electronic control panel being tested;
   a plurality of monitoring means for measuring and providing visual indication of the output of said plurality of power supplies and the output of an electronic control panel being tested;
   a plurality of visual indicator means for indicating the status of the simulator and testing device, and the status of an electronic control panel being tested;
   an interconnecting means to electrically couple the simulator and testing appparatus to an electronic control panel being tested;
   an AC frequency generator means for generating and AC electrical input signal for an electronic control panel being tested; and
   a switching/routing means for controlling and directing the electrical input signals to specific circuits within an electronic control panel being tested.

2. A simulator and control panel testing apparatus as defined by claim 1 wherein said AFSE and MFSE testing circuit provides circuitry to load the AFSE and MFSE of an electronic control panel being tested, and said AFSE and MFSE test circuit provides circuitry to control said visual indicator means to provide an indication as to the status of the AFSE and MFSE circuits in an electronic control panel being tested.

3. A simulator and control panel testing apparatus as defined by claim 2 wherein said plurality of monitor means comprises both analog monitors and digital monitors.

4. A simulator and control panel testing apparatus as defined by claim 3 wherein said analog monitors monitor the operational outputs of an electronic control panel being tested.

5. A simulator and control panel testing apparatus as defined by claim 4 wherein said analog monitors are identical to the analog monitors used in an off-highway vehicle to measure selected operating parameters.

6. A simulator and control panel testing apparatus as defined by claim 5 wherein said plurality of visual indicator means comprises a plurality of indicator lights.

7. A simulator and control panel testing apparatus as defined by claim 6 wherein said plurality of monitor means displays measurements of the status of said plurality of power supplies, the status of said AC frequency generator means, and the status of the outputs of an electronic control panel being tested as determined by said switching/routing means.

8. A simulator and control panel testing apparatus as defined by claim 7 wherein said indicator lights visually indicate the status of the isolation warning circuits within an electronic control panel being tested.

9. A simulator and control panel testing apparatus as defined by claim 8 wherein one of said digital monitor means measures the output of said AC frequency generator means.

10. A simulator and control panel testing apparatus as defined by claim 9 wherein said interconnection means comprises two wiring harnesses each having multipin plugs that are connected to two receivers on the simulator and control panel testing apparatus, and said wiring harnesses each having connector elements which electrically couple the wiring harness to an electronic control panel to be tested.

11. A simulator and control panel testing apparatus as defined by claim 10 wherein the simulator and control panel testing apparatus comprises a plurality of wiring harnesses, each pair of harnesses having different connector elements specifically designed for a plurality of different models of control panels.

12. A simulator and control panel testing apparatus as defined by claim 10 wherein said plurality of power supplies comprise a 27 VDC power supply, a 0 to 13 VDC power supply, a 0 to 4 VDC power supply, a 0 to positive or negative 15 VDC power supply and a 0 to 2000 VDC power supply.

13. A simulator and control panel testing apparatus as defined by claim 12 wherein said 27 VDC power supply, said 0 to 13 VDC power supply, said 0 to 4 VDC power supply and said 0 to positive or negative 15 VDC power supply are provided with external posts so that testing of electronic devices can be conducted without said interconnection means.

14. A simulator and control panel testing apparatus as defined by claim 13 wherein said AC frequency generator means is provided with external posts so that testing of electronic devices can be conducted without said interconnection means.

15. A simulator and control panel testing apparatus as defined by claim 14 wherein one of said digital monitor means is provided with external posts so that testing of electronic devices can be conducted without said interconnection means.

16. A simulator and control panel testing apparatus as defined by claim 15 wherein said plurality of power supplies, said AC frequency generator means, and said AFSE and MFSE pulse testing circuit, are housed inside a single compact housing.

17. A simulator and control panel testing apparatus as defined by claim 16 wherein said monitor means, said plurality of visual indicator means and said switching/routing means are mounted to the front panel of said housing for easy access by said operator.

18. A simulator and control panel testing apparatus as defined by claim 17 wherein said master power supply, said 27 VDC power supply and said 0 to 2000 VDC power supply are provided with protective fuses that are mounted on said front panel of said housing.

19. A method of out of vehicle testing of electronic control panels for an off-highway vehicle comprising the following steps:

removing an electronic control panel to be tested from a vehicle;

electrically coupling an electronic control panel to be tested to an apparatus that can provide electrical signal ranges to an electronic control panel which simulate the operating signals directed to an electronic control panel when in an operating vehicle;

manipulating the electrical signal ranges being directed to an electronic control panel so that the signals are at levels dictated by previously established standards;

mainpulating switching means so that the correct electrical signals are directed to the correct circuit in an electronic control panel;

measuring the output signals of an electronic control panel in response to the inputted electrical signals;

comparing the measured output signals with established output signals for correctly operating electronic control panels; and recalibrating, where necessary, specific circuits within an electronic control panel that has been tested.

20. A method for testing as defined by claim 19 wherein comparing is accomplished by plotting the outputs of an electronic control panel that has been tested to form a performance curve which is compared to a performance curve for a correctly operating control panel.

* * * * *